US012727370B2

(12) United States Patent
Kim et al.

(10) Patent No.: US 12,727,370 B2
(45) Date of Patent: Sep. 1, 2026

(54) POLARIZING PLATE, AND OPTICAL DISPLAY DEVICE INCLUDING SAME

(71) Applicant: SAMSUNG SDI CO., LTD., Yongin-si (KR)

(72) Inventors: Bong Choon Kim, Suwon-si (KR); Yeon Ju Jung, Suwon-si (KR); Seo Young Kang, Suwon-si (KR); Seon Oh Hwang, Suwon-si (KR); Kwang Ho Shin, Suwon-si (KR); Jong Kyu Choi, Suwon-si (KR); Il Woong Baek, Suwon-si (KR)

(73) Assignee: WUXI HENGXIN OPTOELECTRONIC MATERIALS CO., LTD., Wuxi (CN)

( * ) Notice: Subject to any disclaimer, the term of this patent is extended or adjusted under 35 U.S.C. 154(b) by 290 days.

(21) Appl. No.: 18/551,800

(22) PCT Filed: Mar. 22, 2022

(86) PCT No.: PCT/KR2022/003939

§ 371 (c)(1),
(2) Date: Sep. 21, 2023

(87) PCT Pub. No.: WO2022/203329

PCT Pub. Date: Sep. 29, 2022

(65) Prior Publication Data

US 2024/0192419 A1 Jun. 13, 2024

(30) Foreign Application Priority Data

Mar. 26, 2021 (KR) ........................ 10-2021-0040009

(51) Int. Cl.
*H10K 59/80* (2023.01)
*G02B 1/08* (2006.01)
(Continued)

(52) U.S. Cl.
CPC ........... *H10K 59/8791* (2023.02); *G02B 1/08* (2013.01); *G02B 1/14* (2015.01); *G02B 5/305* (2013.01); *G02B 5/3083* (2013.01)

(58) Field of Classification Search
CPC ...... H10K 59/8791; H10K 59/50; G02B 1/08; G02B 1/14; G02B 5/305; G02B 5/3083;
(Continued)

(56) References Cited

U.S. PATENT DOCUMENTS

2015/0002010 A1 1/2015 Lee et al.
2019/0154899 A1* 5/2019 Murashige ........... G02B 5/3083
(Continued)

FOREIGN PATENT DOCUMENTS

KR 10-2013-0103595 A 9/2013
KR 10-2015-0002354 A 1/2015
(Continued)

OTHER PUBLICATIONS

Korean Office Action dated Mar. 26, 2024, issued in corresponding Korean Patent Application No. 10-2021-0040009 (6 pages).
(Continued)

*Primary Examiner* — Stephone B Allen
*Assistant Examiner* — Adam W Booher
(74) *Attorney, Agent, or Firm* — Ricky Lam

(57) ABSTRACT

Provided are a polarizing plate and an optical display device including same, the polarizing plate comprising: a polarizer; and a laminate having a first phase difference layer and a second phase difference layer laminated on the lower surface of the polarizer, wherein the short wavelength dispersion of the first phase difference layer is less than the short wavelength dispersion of the second phase difference layer, the first phase difference layer has, at a wavelength of 550 nm, an in-plane phase difference of 280 nm to 400 nm and a degree of biaxiality of more than 1 and less than 1.6, the
(Continued)

140
130
110
120 second phase difference layer has, at a wavelength of 550 nm, an in-plane phase difference of 140 nm to 260 nm 550 nm and a degree of biaxiality of less than 0, and the difference between the in-plane phase difference of the first phase difference layer and the in-plane phase difference of the second phase difference layer at a wavelength of 550 nm is 130 nm to 150 nm.

19 Claims, 1 Drawing Sheet

(51) Int. Cl.
*G02B 1/14* (2015.01)
*G02B 5/30* (2006.01)

(58) Field of Classification Search
CPC . G02B 1/04; G02B 5/30; G02B 5/3033; C08J 7/04; C08J 7/042; C09D 101/08; C09D 201/00
See application file for complete search history.

(56) References Cited

U.S. PATENT DOCUMENTS

| | | | | |
|---|---|---|---|---|
| 2019/0278010 | A1* | 9/2019 | Sakai | G02F 1/13363 |
| 2020/0212367 | A1 | 7/2020 | Kim et al. | |

FOREIGN PATENT DOCUMENTS

| | | | | |
|---|---|---|---|---|
| KR | 10-2018-0041610 | A | 4/2018 | |
| KR | 10-2019-0076792 | A | 7/2019 | |
| KR | 10-2020-0116837 | A | 10/2020 | |
| KR | 10-2020-0144919 | A | 12/2020 | |
| KR | 10-2021-0019356 | A | 2/2021 | |
| WO | WO 2020/137409 | A1 | 7/2020 | |
| WO | WO-2020204411 | A1 * | 10/2020 | G02B 5/3083 |
| WO | WO-2021029626 | A1 * | 2/2021 | G02B 5/3083 |

OTHER PUBLICATIONS

Korean Office Action dated Dec. 30, 2024, issued in corresponding Korean Patent Application No. 10-2021-0040009 (7 pages).

International Search Report of PCT/KR2022/003939, Jun. 24, 2022, 4 pp.

* cited by examiner

【FIG. 1】
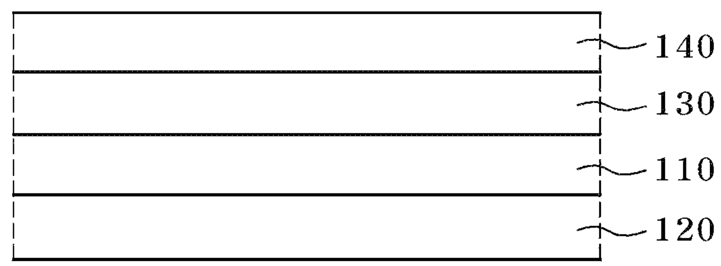
【FIG. 2】
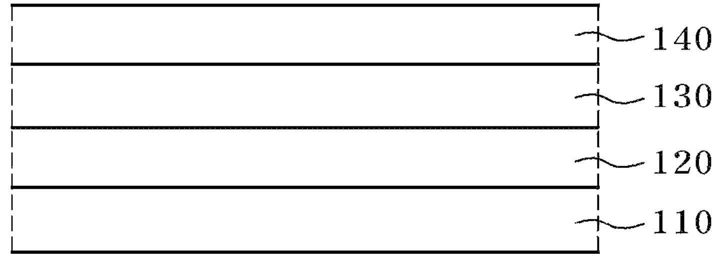

POLARIZING PLATE, AND OPTICAL DISPLAY DEVICE INCLUDING SAME

CROSS-REFERENCE TO RELATED APPLICATIONS

This application is a U.S. National Phase Patent Application of International Application Number PCT/KR2022/003939, filed on Mar. 22, 2022, which claims priority to Korean Patent Application Number 10-2021-0040009, filed on Mar. 26, 2021, the entire content of each of which is incorporated herein by reference.

TECHNICAL FIELD

The present invention relates to a polarizing plate and an optical display device comprising the same. More particularly, the present invention relates to a polarizing plate, which has good properties in terms of economic feasibility, processability and reliability while achieving remarkable improvement in screen quality through improvement in black visibility at a front side thereof when applied to an optical display device, and an optical display device comprising the same.

BACKGROUND ART

An organic light emitting diode display can suffer from deterioration in visibility and contrast due to reflection of external light. To solve this problem, a polarizing plate including a polarizer and a retardation film may be used to realize an antireflection function by preventing reflected external light from leaking out. Fundamentally, the polarizing plate is required to achieve remarkable improvement in screen quality through improvement in black visibility at a front side thereof.

Typically, a polarizing plate for antireflection includes a double-sheet type retardation layer or a single sheet type retardation layer on a lower surface of the polarizer. The double-sheet type retardation layer is composed of a ¼ retardation plate and a ½ retardation plate. The double-sheet type retardation layer may be formed by stretching a non-stretched film in an oblique direction and coating a liquid crystal compound or a certain polymer thereon to form a coat, followed by stretching the entirety of the stretched film and the coat in a certain direction, for example, in a MD (machine direction), of the film. However, this method is complicated and has low economic feasibility. In particular, since liquid crystals require an alignment film, a process for formation of the alignment film is required and the alignment film has low reliability due to high possibility of variation in phase retardation due to external heat or humidity.

A technique for providing an antireflection function through addition of a pattern layer to a typical polarizing plate is being developed. However, addition of a separate pattern layer to the polarizing plate requires an additional process and can increase the thickness of the polarizing plate.

The background technique of the present invention is disclosed in Korean Patent Laid-open Publication No. 10-2013-0103595 and the like.

DISCLOSURE

Technical Problem

It is one aspect of the present invention to provide a polarizing plate that can be manufactured through a simple process at low cost to secure good economic feasibility and processability.

It is another aspect of the present invention to provide a polarizing plate including a non-liquid crystal layer as a retardation layer to secure good reliability.

It is a further aspect of the present invention to provide a polarizing plate that has low reflectivity at a front side thereof to achieve remarkable improvement in screen quality through improvement in black visibility at the front side thereof when applied to an optical display device.

It is yet another aspect of the present invention to provide a polarizing plate that has front color values near neutral color values to improve black visibility, thereby achieving remarkable improvement in screen quality when applied to an optical display device.

Technical Solution

One aspect of the present invention relates to a polarizing plate.

1. The polarizing plate includes: a polarizer and a laminate of a first retardation layer and a second retardation layer stacked on a lower surface of the polarizer, wherein short wavelength dispersion of the first retardation layer is less than short wavelength dispersion of the second retardation layer, the first retardation layer has an in-plane retardation of 280 nm to 400 nm and a degree of biaxiality of greater than 1 to less than 1.6 at a wavelength of 550 nm, the second retardation layer has an in-plane retardation of 140 nm to 260 nm and a degree of biaxiality of less than 0 at a wavelength of 550 nm, and a difference between in-plane retardation of the first retardation layer at a wavelength of 550 nm and in-plane retardation of the second retardation layer at a wavelength of 550 nm is in the range of 130 nm to 150 nm.

2. In 1, the first retardation layer may include a compound having positive (+) birefringence, and the second retardation layer may include a compound having negative (−) birefringence.

3. In 1 to 2, each of the first retardation layer and the second retardation layer may be a non-liquid crystal layer.

4. In 1 to 3, the first retardation layer may include at least one resin of cellulose based, polyester based, cyclic polyolefin based, cyclic olefin copolymer based, polycarbonate based, polyethersulfone based, polysulfone based, polyamide based, polyimide based, polyolefin based, polyarylate based, polyvinylalcohol based, polyvinylchloride based, polyvinylidenechloride based, and acrylic based resins.

5. In 1 to 4, the second retardation layer may include at least one of a cellulose based compound and an aromatic based compound.

6. In 5, the cellulose based compound may include at least one of a cellulose ester based compound and a cellulose ether based compound.

7. In 1 to 6, the second retardation layer may have a degree of biaxiality of about −1.0 to about −0.1 at a wavelength of 550 nm.

8. In 1 to 7, the first retardation layer may have a slow axis placed in an oblique direction with respect to a MD (machine direction) of the first retardation layer at a wavelength of 550 nm.

9. In 8, the slow axis of the first retardation layer may be tilted at an angle of about 430 to about 47° with respect to the MD (machine direction) of the first retardation layer.

10. In 1 to 9, the second retardation layer may have a slow axis placed in an oblique direction with respect to a MD (machine direction) of the first retardation layer or the second retardation layer at a wavelength of 550 nm.

11. In 10, the slow axis of the second retardation layer may be tilted at an angle of about 1330 to about 1370 with respect to the MD of the first retardation layer or the second retardation layer.

12. In 1 to 11, the first retardation layer may have flat wavelength dispersion or positive wavelength dispersion, and the second retardation layer may have positive wavelength dispersion.

13. In 1 to 12, the first retardation layer may be a positive A plate or a negative B plate, and the second retardation layer may be a negative A plate or a positive B plate.

14. In 1 to 13, long wavelength dispersion of the first retardation layer may be greater than that of the second retardation layer.

15. In 1 to 14, the first retardation layer may have a short wavelength dispersion of about 0.95 to about 1.06 and a long wavelength dispersion of about 0.96 to about 1.03, and the second retardation layer may have a short wavelength dispersion of about 1 to about 1.2 and a long wavelength dispersion of about 0.90 to about 1.

16. In 1 to 15, a slow axis of the first retardation layer may be tilted at an angle of about 440 to 460 and a slow axis of the second retardation layer may be tilted at an angle of 1340 to 1360 with reference to a transmission axis of the polarizer.

17. In 1 to 16, a slow axis of the first retardation layer may be tilted at an angle of 1340 to 1360 and a slow axis of the second retardation layer may be tilted at an angle of 440 to 460 with reference to the transmission axis of the polarizer.

18. In 1 to 17, the first retardation layer and the second retardation layer may be sequentially stacked in the stated order on the lower surface of the polarizer, or the second retardation layer and the first retardation layer may be sequentially stacked in the stated order on the lower surface of the polarizer.

19. In 1 to 18, the polarizing plate may further include a protective layer on an upper surface of the polarizer.

Another aspect of the present invention relates to an optical display device.

The optical display device includes the polarizing plate according to the present invention.

Advantageous Effects

The present invention provides a polarizing plate that can be manufactured through a simple process at low cost to secure good economic feasibility and processability.

The present invention provides a polarizing plate including a non-liquid crystal layer as a retardation layer to secure good reliability.

The present invention provides a polarizing plate that has low reflectivity at a front side thereof to achieve remarkable improvement in screen quality through improvement in black visibility at the front side thereof when applied to an optical display device.

The present invention provides a polarizing plate that has front color values near neutral color values to improve black visibility, thereby achieving remarkable improvement in screen quality when applied to an optical display device.

DESCRIPTION OF DRAWINGS

FIG. 1 is a sectional view of a polarizing plate according to one embodiment of the present invention.

FIG. 2 is a sectional view of a polarizing plate according to another embodiment of the present invention.

BEST MODE

Hereinafter, exemplary embodiments of the present invention will be described in detail with reference to the accompanying drawings such that the present invention can be easily implemented by those skilled in the art. It should be understood that the present invention may be embodied in different ways and is not limited to the following embodiments.

In the drawings, components unrelated to description are omitted for clear description of the invention and like components will be denoted by like reference numerals throughout the specification. Although lengths, thicknesses or widths of various components may be exaggerated for understanding in the drawings, the present invention is not limited thereto.

Herein, spatially relative terms, such as "upper" and "lower", are defined with reference to the accompanying drawings. Thus, it will be understood that the term "upper surface" can be used interchangeably with the term "lower surface".

Herein, "in-plane retardation Re", "degree of biaxiality NZ" and "out-of-plane retardation Rth" are represented by Equations A, B and C, respectively:

$$Re = (nx - ny) \times d \quad \text{[Equation A]}$$

$$NZ = (nx - nz)/(nx - ny) \quad \text{[Equation B]}$$

$$Rth = ((nx + ny)/2 - nz) \times d \quad \text{[Equation C]}$$

where nx, ny, and nz are indexes of refraction of an optical device in a slow axis direction, a fast axis direction and a thickness direction thereof at a measurement wavelength, respectively, and d denotes the thickness of the optical device (unit: nm). In Equations A to C, the measurement wavelength may be 450 nm, 550 nm, or 650 nm. Here, the slow axis means an axis having the highest index of refraction in the in-plane direction and the fast axis means an axis having the lowest index of refraction in the in-plane direction.

Herein, "short wavelength dispersion" refers to Re(450)/Re(550) and "long wavelength dispersion" refers to Re(650)/Re(550), wherein Re(450), Re(550) and Re(650) refer to in-plane retardation (Re) of a retardation layer at wavelengths of 450 nm, 550 nm, and 650 nm, respectively.

As used herein to represent an angle with respect to a certain reference (for example, a transmission axis of a polarizer), "+" means the counterclockwise direction and "−" means the clockwise direction, assuming that the reference is placed at 00.

Herein, front color values "a*" and "b*" indicate color values of a single polarizing plate in one region thereof and mean the a* value and the b* value in the CIE coordinate system, respectively. The color values a* and b* may be obtained from the CIE coordinate system in which the x-axis indicating a values is orthogonal to the y-axis indicating b values. The a* value becomes red with increasing absolute value in a positive direction and becomes green with increasing absolute value in a negative direction, and the b* value becomes yellow with increasing absolute value in the positive direction and becomes blue with increasing absolute value in the negative direction.

As used herein to represent a specific numerical range, the expression "X to Y" means "greater than or equal to X and less than or equal to Y (X≤ and ≤Y)".

A polarizing plate according to the present invention includes a laminate of a first retardation layer having positive (+) birefringence and a second retardation layer having negative (−) birefringence. The laminate of the first retardation layer and the second retardation layer may be produced by coating a non-liquid crystal composition for the second retardation layer on a non-stretched film for the first retardation layer to form a coat, followed by stretching the entirety of the non-stretched film and the coat in an oblique direction with reference to the MD (machine direction) of the non-stretched film. That is, the laminate of the first retardation layer and the second retardation layer may be formed by coating the composition once to form the coat for the second retardation layer, followed by stretching the entirety of the coat and the film once in the oblique direction. Accordingly, the polarizing plate according to the present invention is produced through a simple, inexpensive process to provide good economic feasibility and processability.

The polarizing plate according to the present invention may include a laminate of a first retardation layer having positive (+) birefringence and a second retardation layer having negative (−) birefringence, wherein short wavelength dispersion of the first retardation layer is less than short wavelength dispersion of the second retardation layer and each of the first retardation layer and the second retardation layer has an in-plane retardation and a degree of biaxiality described below while satisfying a predetermined range of difference in in-plane retardation therebetween. With this structure, the polarizing plate according to the present invention may have good economic feasibility and processability while achieving remarkable improvement in screen quality through improvement in black visibility with low reflectivity at a front side thereof when applied to an optical display device. Accordingly, the polarizing plate according to the present invention may be used as a polarizing plate for antireflection in a light emitting diode display comprising an organic light emitting diode display and the like.

In one embodiment, assuming that an OLED panel includes a completely reflective plate at a front side thereof, the polarizing plate may have a specular reflectivity of about 0.5% or less excluding primary surface reflection, preferably about 0% to about 0.4%, when applied to an optical display device. Within this range, the polarizing plate can improve screen quality. In one embodiment, the polarizing plate may have an a* value of about 0 to about 20 and a b* value of about −20 to about 0 among front color values when applied to the optical display device. Within this range, the polarizing plate can improve screen quality.

The polarizing plate according to the present invention may include a laminate of a first retardation layer having positive (+) birefringence and a second retardation layer having negative (−) birefringence, wherein each of the first retardation layer and the second retardation layer is a non-liquid crystal layer, and thus can be manufactured at low cost, thereby securing good economic feasibility while improving reliability of the retardation layers or the polarizing plate. The retardation layer formed of liquid crystals can have low reliability due to variation in retardation due to heat or high humidity, and the liquid crystals are more expensive than typical non-liquid crystal resins.

In addition, even without a pattern layer on a lower surface of the polarizer, the polarizing plate according to the present invention has low reflectivity at a font side thereof, thereby improving black visibility at the front side thereof.

Next, a polarizing plate according to one embodiment of the invention will be described with reference to FIG. 1.

Referring to FIG. 1, the polarizing plate includes a polarizer (130), a protective film (140) stacked on an upper surface of the polarizer (130), and a first retardation layer (110) and a second retardation layer (120) sequentially stacked on a lower surface of the polarizer (130) in the stated order from the polarizer (130).

According to one embodiment, the protective film (140) may be a protective coating layer. The polarizing plate may omit the protective film (140) so long as the polarizing plate can provide inherent functions thereof.

In some embodiments, the polarizing plate may further include another optical layer (for example: retardation layer) between the first retardation layer and the second retardation layer, between the polarizer and the first retardation layer, or on a lower surface of the second retardation layer so long as the other optical layer does not affect the effects realized by each of the first retardation layer and the second retardation layer or a combination of the first retardation layer and the second retardation layer.

Although not shown in FIG. 1, the polarizing plate may further include an adhesive layer or a bonding layer on the lower surface of the second retardation layer (120) such that the polarizing plate can be adhesively attached to an optical display panel therethrough.

Herein, the first retardation layer (110) is defined as a layer having higher in-plane retardation than the second retardation layer (120) at the same wavelength.

The polarizing plate according to the present invention is a polarizing plate for antireflection and can realize a function of reducing reflectivity at front and lateral sides thereof while securing good processability and economic feasibility. The first retardation layer (110) includes a resin having positive (+) birefringence and the second retardation layer (120) includes a resin having negative (−) birefringence.

Herein, "positive (+) birefringence" means characteristics of a film exhibiting birefringence upon stretching of the film and having an index of refraction increasing in the stretching direction. Herein, "negative (−) birefringence" means characteristics of a film exhibiting birefringence upon stretching of the film and having an index of refraction increasing in a perpendicular direction to the stretching direction.

The first retardation layer (110) may include a compound (for example, resin) exhibiting positive (+) birefringence characteristics. For example, the resin may be optically transparent and may include a non-liquid crystal resin. The "non-liquid crystal" is not at least one of a liquid crystal monomer, a liquid crystal oligomer and a liquid crystal polymer, and may include a material that is not converted into a liquid crystal monomer, a liquid crystal oligomer, or a liquid crystal polymer through illumination or heat treatment.

In one embodiment, the resin for the first retardation layer (110) may include at least one of cellulose based resins comprising triacetylcellulose and the like, polyester based resins comprising polyethylene terephthalate (PET), polybutylene terephthalate, polyethylene naphthalate (PEN), polybutylene naphthalate, and the like, cyclic polyolefin (COP) based resins, cyclic olefin copolymer (COC) based resins, polycarbonate based resins, polyethersulfone based resins, polysulfone based resins, polyamide based resins, polyimide based resins, polyolefin based resins, polyarylate based resins, polyvinylalcohol based resins, polyvinylchloride based resins, polyvinylidenechloride based resins, and acrylic based resins. Preferably, the resin may include a cyclic polyolefin based resin for easy realization of wavelength dispersion and retardation described below. The cyclic polyolefin based resin can easily realize the effects of the present invention.

The first retardation layer (110) may include the resin or a coating layer formed of a composition containing the resin. For easy formation of the second retardation layer, the first retardation layer (110) may include the resin or a stretched film formed of a composition containing the resin.

The first retardation layer may further include typical additives known to those skilled in the art. The additives may include pigments, antioxidants, and the like, without being limited thereto.

A method for forming the first retardation layer (110) will be described in detail below.

The second retardation layer (120) may include a compound (for example, resin) exhibiting negative (−) birefringence characteristics. For example, the resin may be optically transparent and may include a non-liquid crystal resin. The "non-liquid crystal" is not at least one of a liquid crystal monomer, a liquid crystal oligomer and a liquid crystal polymer, and may include a material that is not converted into a liquid crystal monomer, a liquid crystal oligomer, or a liquid crystal polymer through illumination or heat treatment. When the second retardation layer is formed of liquid crystals, the polarizing plate essentially includes an alignment layer for alignment of the liquid crystals at a certain angle, thereby causing generation of foreign matter. Accordingly, the polarizing plate according to the present invention may omit the alignment layer. In addition, the liquid crystals can suffer from variation in retardation due to external heat or moisture and are more expensive than typical polymer resins, causing low economic feasibility. For example, the resin may include at least one of a cellulose based resin and an aromatic based resin.

In one embodiment, the second retardation layer may include at least one of a cellulose based compound and an aromatic based compound. Here, the "compound" may mean a monomer, an oligomer, a polymer, or a resin.

Hereinafter, the cellulose based compound will be described.

The cellulose based compound may include at least a unit, in which at least some hydroxyl groups [a $C_2$ hydroxyl group, a $C_3$ hydroxyl group or a $C_6$ hydroxyl group] of a sugar monomer constituting cellulose are substituted with an acyl group or an ether group. That is, the cellulose based compound may include at least one of a cellulose ester based compound and a cellulose ether based compound.

For example, the cellulose based compound may include a cellulose ester compound including at least a unit, in which at least some hydroxyl groups [a $C_2$ hydroxyl group, a $C_3$ hydroxyl group or a $C_6$ hydroxyl group] of a sugar monomer constituting cellulose are substituted with an acyl group, as represented by Formula 1. Here, the acyl group may be substituted or unsubstituted.

[Formula 1]

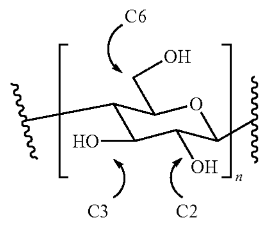

(wherein Formula 1, n is an integer of 1 or more).

A substituent group for the cellulose ester based or the acyl group may include at least one of a halogen, a nitro group, an alkyl group (for example, a $C_1$ to $C_{20}$ alkyl group), an alkenyl group (for example, a $C_2$ to $C_{20}$ alkenyl group), a cycloalkyl group (for example, a $C_3$ to $C_{10}$ cycloalkyl group), an aryl group (for example, a $C_6$ to $C_{20}$ aryl group), a heteroaryl group (for example, a $C_3$ to $C_{10}$ heteroaryl group), an alkoxy group (for example, a $C_1$ to $C_{20}$ alkoxy group), an acyl group, and a halogen-containing functional group. The substituent groups may be the same as or different from each other.

Herein, "acyl" may mean R—C(═O)—* (* being a linking site, R being a $C_1$ to $C_{20}$ alkyl group, a $C_3$ to $C_{20}$ cycloalkyl group, a $C_6$ to $C_{20}$ aryl group, or a $C_7$ to $C_{20}$ arylalkyl group), as well-known in the art. The "acyl" is coupled to a ring of the cellulose through ester bonding (through an oxygen atom) in the cellulose.

Here, "alkyl", "alkenyl", "cycloalkyl", "aryl", "heteroaryl", "alkoxy", and "acyl" refer to non-halogen based compounds for convenience. The composition for the second retardation layer may include the cellulose ester based alone or a mixture comprising the cellulose ester based.

Here, "halogen" means fluorine (F), Cl, Br, or I, preferably F.

The "halogen-containing functional group" is an organic functional group containing at least one halogen and may include an aromatic, aliphatic or alicyclic functional group. For example, the halogen-containing functional group may mean a halogen-substituted $C_1$ to $C_{20}$ alkyl group, a halogen-substituted $C_2$ to $C_{20}$ alkenyl group, a halogen-substituted $C_2$ to $C_{20}$ alkynyl group, a halogen-substituted $C_3$ to $C_{10}$ cycloalkyl group, a halogen-substituted $C_1$ to $C_{20}$ alkoxy group, a halogen-substituted acyl group, a halogen-substituted $C_6$ to $C_{20}$ aryl group, or a halogen-substituted $C_7$ to $C_{20}$ arylalkyl group, without being limited thereto.

The "halogen-substituted acyl group" may be R'—C(═O)—* (* being a linking site, R' being a halogen-substituted $C_1$ to $C_{20}$ alkyl group, a halogen-substituted $C_3$ to $C_{20}$ cycloalkyl, a halogen-substituted $C_6$ to $C_{20}$ aryl, or a halogen-substituted $C_7$ to $C_{20}$ arylalkyl). The "halogen-substituted acyl group" may be coupled to a ring of the cellulose through ester bonding (through an oxygen atom) in the cellulose.

For formation of the second retardation layer, the cellulose ester based compound may be prepared by a typical method known to those skilled in the art or may be obtained from commercially available products. For example, the cellulose ester based compound having an acyl group as a substituent group may be prepared by reacting trifluoroacetic acid or trifluoroacetic anhydride with the sugar monomer constituting the cellulose represented by Formula 1 or a polymer of the sugar monomer, by reacting trifluoroacetic acid or trifluoroacetic anhydride therewith, followed by additionally reacting an acylation agent (for example, an anhydride of carboxylic acid, or carboxylic acid) therewith, or by reacting both trifluoroacetic acid or trifluoroacetic anhydride and the acylation agent therewith.

The aromatic based compound includes a phenyl group and may include a polystyrene based compound or a fluorobenzene or difluorobenzene structure, without being limited thereto. In one embodiment, the polystyrene compound may include a moiety represented by Formula 2:

[Formula 2]

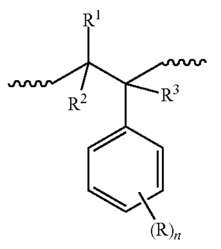

(wherein Formula 2, 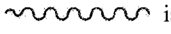 is a linking site of an element, $R^1$, $R^2$, and $R^3$ are each independently a hydrogen atom, an alkyl group, a substituted alkyl group, or a halogen, Rs are each independently a substituent group on a styrene ring, and n is an integer of 0 to 5 indicating the number of substituent groups on the styrene ring.

Examples of the substituent group R on the styrene ring may include an alkyl group, a substituted alkyl group, a halogen, a hydroxyl group, a carboxyl group, a nitro group, an alkoxy group, an amino group, a sulfonate group, a phosphate group, an acyl group, an acyloxy group, a phenyl group, an alkoxycarbonyl group, and a cyano group.

In one embodiment, at least one of $R^1$, $R^2$ and $R^3$ may be a halogen, preferably fluorine.

A composition for the second retardation layer may further include an aromatic fused ring-containing additive in addition to the cellulose based compound and the aromatic based compound. The aromatic fused ring-containing additive serves to adjust wavelength dispersion. The aromatic fused ring-containing additive may include 2-naphthyl benzoate, anthracene, phenanthrene, 2,6-naphthalene dicarboxylic acid diester, and the like. The aromatic fused ring-containing additive may be present in an amount of 0.1 wt % to 30 wt %, preferably 1 wt % to 10 wt %, in the composition for the second retardation layer. Within this range, the aromatic fused ring-containing compound can adjust retardation and wavelength dispersion.

The second retardation layer may further include typical additives known to those skilled in the art. The additives may include pigments, antioxidants, and the like, without being limited thereto.

Next, a method for forming the laminate of the first retardation layer and the second retardation layer will be described.

The laminate of the first retardation layer and the second retardation layer may be formed by coating the composition for the second retardation layer to a predetermined thickness on a lower surface of a non-stretched film for the first retardation layer to form a coat, followed by stretching the entirety of the non-stretched film and the coat in an oblique direction with reference to the MD (machine direction) of the non-stretched film. As such, the laminate of the first retardation layer and the second retardation layer may be formed by coating the composition once, followed by stretching once in the oblique direction, thereby providing good effects in terms of processability and economic feasibility.

The non-stretched film for the first retardation layer may include a film produced from a resin, which exhibits positive (+) birefringence even after oblique stretching, or a composition comprising the same, through a typical method, such as melt extrusion and the like. A method for producing the non-stretched film may be carried out by a typical method known to those skilled in the art.

The composition for the second retardation layer may include a resin exhibiting negative (−) birefringence even after formation of a coating layer and oblique stretching, for example, at least one selected from among the cellulose based compound and the aromatic based compound. The composition may further include a typical additive, a solvent, and the like.

The second retardation layer may be formed by coating the composition for the second retardation layer to a predetermined thickness on a lower surface of the non-stretched film to form a coat. Coating may be performed by a typical method known to those skilled in the art, for example, spin coating, die coating, Meyer bar coating, and the like. The thickness of the coat may be suitably adjusted to, for example, about 3 μm to about 30 μm, preferably about 3 μm to about 20 μm, depending upon the thickness of the second retardation layer described below.

Each of the first retardation layer and the second retardation layer can realize phase retardation through oblique stretching. Oblique stretching may include stretching the corresponding non-stretched film in an oblique direction of about 430 to about 47°, specifically about 44° to about 46°, with reference to the MD of the non-stretched film for the first retardation layer. Within this range, the phase retardation of each of the first retardation layer and the second retardation layer can be efficiently realized.

In one embodiment, the slow axis of the first retardation layer at a wavelength of 550 nm may be placed in the oblique direction, for example, at an angle of about 43° to about 47°, for example, 43°, 44°, 45°, 46°, or 47°, with respect to the MD (machine direction) of the first retardation layer. Within this range, the effects of the present invention can be efficiently realized.

In one embodiment, the slow axis of the second retardation layer at a wavelength of 550 nm may be placed in the oblique direction, for example, at an angle of about 1330 to about 137°, for example, 133°, 134°, 135°, 136°, or 137°, with respect to the MD (machine direction) of the first retardation layer or the second retardation layer. Within this range, the effects of the present invention can be efficiently realized.

Upon oblique stretching, the non-stretched film may be stretched to about 1.1 times to about 4 times an initial length thereof. Within this range, the phase retardation of each of the first retardation layer and the second retardation layer can be efficiently realized.

Next, each of the first retardation layer and the second retardation layer will be described in more detail.

The first retardation layer (110) may have an in-plane retardation of 280 nm to 400 nm and a degree of biaxiality of greater than 1 to less than 1.6 at a wavelength of 550 nm; the second retardation layer (120) may have an in-plane retardation of 140 nm to 260 nm and a degree of biaxiality of less than 0 at a wavelength of 550 nm; and short wavelength dispersion of the first retardation layer is less than that of the second retardation layer. With this structure, the laminate of the first retardation layer (110) and the second retardation layer (120) can assist in improvement in black visibility and screen quality through significant reduction in reflectivity at front and lateral sides while realizing front color values according to the present invention.

The first retardation layer (110) may have an in-plane retardation of 280 nm to 400 nm, for example, 280 nm, 285 nm, 290 nm, 295 nm, 300 nm, 305 nm, 310 nm, 315 nm, 320 nm, 325 nm, 330 nm, 335 nm, 340 nm, 345 nm, 350 nm, 355 nm, 360 nm, 365 nm, 370 nm, 375 nm, 380 nm, 385 nm, 390 nm, 395 nm, 400 nm, specifically 300 nm to 350 nm, more specifically 310 nm to 330 nm, at a wavelength of 550 nm. Within this range, the polarizing plate can efficiently realize the effects of the present invention and can be easily manufactured.

The first retardation layer (110) may have a degree of biaxiality of greater than 1 to 1.5, for example, 1.05, 1.1, 1.15, 1.2, 1.25, 1.3, 1.35, 1.4, 1.45, or 1.5, specifically 1.1 to 1.2, more specifically 1.1 to 1.15, at a wavelength of 550 nm. Within this range, the polarizing plate can efficiently realize the effects of the present invention and can be easily manufactured.

The second retardation layer (120) may have an in-plane retardation of 140 nm to 260 nm, for example, 140 nm, 145 nm, 150 nm, 155 nm, 160 nm, 165 nm, 170 nm, 175 nm, 180 nm, 185 nm, 190 nm, 195 nm, 200 nm, 205 nm, 210 nm, 215 nm, 220 nm, 225 nm, 230 nm, 235 nm, 240 nm, 245 nm, 250 nm, 255 nm, or 260 nm, specifically 160 nm to 210 nm, more specifically 170 nm to 190 nm, at a wavelength of 550 nm. Within this range, the polarizing plate can efficiently realize the effects of the present invention and can be easily manufactured.

The second retardation layer (120) may have a degree of biaxiality of −1.0 to −0.1, for example, −1.0, −0.95, −0.90, −0.85, −0.80, −0.75, −0.70, −0.65, −0.60, −0.55, —0.50, −0.45, −0.40, −0.35, −0.30, −0.25, −0.20, −0.15, or −0.1, specifically −0.9 to −0.1, more specifically −0.8 to −0.1, at a wavelength of 550 nm. Within this range, the polarizing plate can efficiently realize the effects of the present invention and can be easily manufactured.

A difference in in-plane retardation between the first retardation layer (110) and the second retardation layer (120) at a wavelength of 450 nm, 550 nm, or 650 nm (in-plane retardation of first retardation layer—in-plane retardation of second retardation layer) may range from 130 nm to 150 nm. Within this range, the polarizing plate can improve black visibility and screen quality through significant reduction in reflectivity at front and lateral sides while realizing front color values according to the present invention. Specifically, the in-plane retardation difference therebetween may be, for example, 130 nm, 131 nm, 132 nm, 133 nm, 134 nm, 135 nm, 136 nm, 137 nm, 138 nm, 139 nm, 140 nm, 141 nm, 142 nm, 143 nm, 144 nm, 145 nm, 146 nm, 147 nm, 148 nm, 149 nm, or 150 nm, specifically 135 nm to 145 nm.

The first retardation layer (110) exhibits flat wavelength dispersion or positive wavelength dispersion; the second retardation layer (120) exhibits positive wavelength dispersion; and the laminate of the first retardation layer (110) and the second retardation layer (120) exhibits negative wavelength dispersion. With this structure, the polarizing plate can improve black visibility and screen quality through significant reduction in reflectivity at front and lateral sides thereof. Here, "flat wavelength dispersion" means that the in-plane retardation is not changed even upon increase in measurement wavelength, "positive wavelength dispersion" means that the in-plane retardation gradually decreases with increasing measurement wavelength, and "negative wavelength dispersion" means that the in-plane retardation gradually increases with increasing measurement wavelength.

Short wavelength dispersion of the first retardation layer (110) is less than that of the second retardation layer (120). With this structure, the polarizing plate can improve black visibility and screen quality through significant reduction in reflectivity at front and lateral sides thereof.

In one embodiment, the first retardation layer (110) may have a short wavelength dispersion of about 0.95 to about 1.06, for example, about 0.95, 0.96, 0.97, 0.98, 0.99, 1.00, 1.01, 1.02, 1.03, 1.04, 1.05, or 1.06, specifically about 0.98 to about 1.05, and the second retardation layer (120) may have a short wavelength dispersion of about 1 to about 1.2, for example, 1, 1.01, 1.02, 1.03, 1.04, 1.05, 1.06, 1.07, 1.08, 1.09, 1.1, 1.11, 1.12, 1.13, 1.14, 1.15, 1.16, 1.17, 1.18, 1.19, or 1.2, specifically about 1.05 to about 1.2, more specifically about 1.1 to about 1.2. Within this range, the relation of short wavelength dispersions between the first and second retardation layers can be easily satisfied, and the first retardation layer and the second retardation layer can be more easily manufactured.

Long wavelength dispersion of the first retardation layer (110) may be greater than that of the second retardation layer (120). With this structure, the polarizing plate can improve black visibility and screen quality through significant reduction in reflectivity at front and lateral sides thereof.

In one embodiment, the first retardation layer (110) may have a long wavelength dispersion of about 0.96 to about 1.03, for example, 0.96, 0.97, 0.98, 0.99, 1.00, 1.01, 1.02, or 1.03, specifically about 0.98 to about 1.01, about 0.99 to about 1, or about 0.995 to about 1, and the second retardation layer (120) may have a long wavelength dispersion of about 0.90 to about 1, for example, 0.90, 0.91, 0.92, 0.93, 0.94, 0.95, 0.96, 0.97, 0.98, 0.99, or 1, specifically about 0.94 to about 1. Within this range, the relation of long wavelength dispersions between the first and second retardation layers can be easily satisfied, and the first retardation layer and the second retardation layer can be more easily manufactured.

The first retardation layer (110) may have optical characteristics of a positive A (nx>ny≈nz) plate or a negative B (nx>ny>nz) plate, and the second retardation layer (120) may have optical characteristics of a negative A (nz≈nx>ny) plate or a positive B (nz>nx>ny) plate. nx, ny, and nz indicate the indexes of refraction of each of the first retardation layer and the second retardation layer in the slow axis direction, the fast axis direction, and the thickness direction thereof at a wavelength of 550 nm, respectively.

In one embodiment, the first retardation layer may be a positive A plate and the second retardation layer may be a negative A plate. In another embodiment, the first retardation layer may be a negative B plate and the second retardation layer may be a positive B plate.

The first retardation layer (110) may have a thickness of about 20 μm to about 100 μm, specifically about 30 μm to about 90 μm, more specifically about 40 μm to about 80 μm. Within this range, the first retardation layer (110) can be used in the polarizing plate.

The second retardation layer (120) may have a thickness of about 3 μm to about 30 μm, preferably about 4 μm to about 25 μm, more preferably about 5 μm to about 20 μm, most preferably about 6 μm to about 15 μm. Within this range, the second retardation layer can exhibit uniform out-of-plane retardation over the entire width thereof.

When the first retardation layer (110) is an obliquely stretched film, the slow axis of the first retardation layer (110) is tilted in a certain range of angle with respect to the transmission axis of the polarizer, thereby reducing reflectivity at font and lateral sides of the polarizing plate while improving ellipticity at the lateral side. The transmission axis of the polarizer is orthogonal to a stretching direction of a polyvinyl alcohol film in fabrication of the polarizer and corresponds to the transverse direction (TD) of the polarizer. Here, "slow axis" of a retardation layer means a direction in which the retardation layer exhibits the highest index of refraction in the in-plane direction thereof. In particular, according to the present invention, when the slow axis of the first retardation layer is substantially orthogonal to the slow axis of the second retardation layer, the effects of the present invention can be easily realized. Here, "substantially orthogonal to" means not only 900 but also an angle in the range of 85° to 95°, preferably 90°.

In one embodiment, the slow axis of the first retardation layer (110) is tilted at an angle of about +440 to about +46° with reference to the transmission axis of the polarizer and the slow axis of the second retardation layer (120) is tilted at an angle of about +133° to about +137°, preferably about +134° to about +136°, with reference to the transmission axis of the polarizer. In another embodiment, the slow axis of the first retardation layer (110) is tilted at an angle of about −44° to about −46° with reference to the transmission axis of the polarizer, and the slow axis of the second retardation layer (120) is tilted at an angle of about −133° to about −137°, preferably about −134° to about −136°, with reference to the transmission axis of the polarizer. Within this range, the effects of the present invention can be efficiently realized.

According to the present invention, an absolute value of the tilt angle of the slow axis of the first retardation layer having a large in-plane retardation at a wavelength of 550 nm with respect to the transmission axis of the polarizer may be less than that of the second retardation layer having a small in-plane retardation at a wavelength of 550 nm.

The laminate of the first retardation layer (110) and the second retardation layer (120) may have an in-plane retardation of about 130 nm to about 150 nm, for example, 130 nm, 131 nm, 132 nm, 133 nm, 134 nm, 135 nm, 136 nm, 137 nm, 138 nm, 139 nm, 140 nm, 141 nm, 142 nm, 143 nm, 144 nm, 145 nm, 146 nm, 147 nm, 148 nm, 149 nm, 150 nm, preferably about 135 nm to about 145 nm, at a wavelength of 550 nm. Within this range, the polarizing plate can reduce reflectivity while increasing ellipticity.

The laminate of the first retardation layer (110) and the second retardation layer (120) may exhibit negative wavelength dispersion and has a short wavelength dispersion of about 0.80 to about 0.95, for example, 0.80, 0.81, 0.82, 0.83, 0.84, 0.85, 0.86, 0.87, 0.88, 0.89, 0.90, 0.91, 0.92, 0.93, 0.94, or 0.95, specifically about 0.82 to about 0.9, and a long wavelength dispersion of about 1.04 to about 1.1, for example, about 1.04, 1.05, 1.06, 1.07, 1.08, 1.09, or 1.1, specifically about 1.05 to about 1.08.

The polarizer (130) may serve to convert natural light or polarized light into linearly polarized light through linear polarization in a certain direction and may be fabricated from a polymer film mainly consisting of a polyvinyl alcohol based resin. Specifically, the polarizer (110) may be fabricated by dyeing the polymer film with iodine or dichroic dyes, followed by stretching the dyed film in the machine direction (MD) thereof. Specifically, the polarizer may be fabricated through swelling, dyeing, stretching, and crosslinking.

The polarizer (130) may have a light transmittance of about 40% or more, for example, about 40% to about 46%, and a degree of polarization of about 95% or more, for example, about 95% to about 99.9%. Within this range, the polarizer can improve antireflection function in combination with the first retardation layer and the second retardation layer. Here, "light transmittance" and "degree of polarization" correspond to visibility at a wavelength of 380 nm to 780 nm.

The polarizer (130) may have a thickness of about 2 μm to about 30 μm, specifically about 4 μm to about 25 μm. Within this range, the polarizer can be used in the polarizing plate.

Although not shown in FIG. 1, the polarizer (130) may be bonded to the laminate of the first retardation layer and the second retardation layer via a first bonding layer. The first bonding layer may be formed of at least one selected from among a water-based bonding agent and a photo-curable bonding agent. Preferably, the first bonding layer is formed of a photo-curable bonding agent to allow bonding between the protective film and the polarizer and between the polarizer and the first retardation layer to be achieved by irradiation once, thereby achieving improvement in processability of the polarizing plate. The first bonding layer may have a thickness of about 0.1 μm to about 10 μm, specifically about 0.5 μm to about 5 μm. Within this range, the first bonding layer can be used in the polarizing plate.

The protective film (140) may be formed on an upper surface of the polarizer (130) to protect the polarizer from an external environment while improving mechanical strength of the polarizing plate.

The protective film (140) serves to protect the polarizer from an external environment and is an optically transparent film. For example, the protective film 140 may be a film formed of at least one resin selected from among cellulose based resins comprising triacetylcellulose (TAC) and the like, polyester based resins comprising polyethylene terephthalate (PET), polybutylene terephthalate, polyethylene naphthalate (PEN), polybutylene naphthalate, and the like, cyclic polyolefin based resins, polycarbonate based resins, polyethersulfone based resins, polysulfone based resins, polyamide based resins, polyimide based resins, polyolefin based resins, polyarylate based resins, polyvinylalcohol based resins, polyvinyl chloride based resins, and polyvinylidenechloride based resins. Specifically, the protective film may be a TAC film or a PET film.

The protective film (140) may have a thickness of about 5 μm to about 70 μm, specifically about 15 μm to about 45 μm. Within this range, the protective film can be used in the polarizing plate.

Although not shown in FIG. 1, a functional coating layer may be formed on an upper surface of the protective film (140) to provide an additional function to the polarizing plate. For example, the functional coating layer may include a hard coating layer, an anti-fingerprint layer, an antireflection layer, an antiglare layer, and the like. These may be used alone or in combination thereof.

Although not shown in FIG. 1, the protective film (140) may be bonded to the polarizer (110) via a second bonding layer. The second bonding layer may be formed of at least one selected from among a water-based bonding agent and a photo-curable bonding agent. Preferably, the second bonding layer is formed of a photo-curable bonding agent to allow bonding between the protective film and the polarizer and between the polarizer and the first retardation layer to be achieved by irradiation once, thereby achieving improvement in processability of the polarizing plate.

In one embodiment, the photocurable bonding agent may be formed of an adhesive composition forming the first bonding layer. In one embodiment, a photoinitiator may initiate chemical reaction through light absorption with respect to light at a wavelength of 300 nm to 400 nm. The photoinitiator may include at least one selected from among a photo-radical initiator and a photo-cationic initiator.

The second bonding layer may have a thickness of about 0.1 μm to about 10 μm, specifically about 0.5 μm to about 5 μm. Within this range, the second bonding layer can be used in the polarizing plate.

Next, a polarizing plate according to another embodiment of the invention will be described with reference to FIG. 2.

Referring to FIG. 2, the polarizing plate may include: a polarizer (130), a protective film (140) stacked on an upper surface of the polarizer (130), and a second retardation layer (120) and a first retardation layer (110) sequentially stacked on a lower surface of the polarizer (130) in the stated order from the polarizer (130). The polarizing plate includes the second retardation layer (120) and the first retardation layer (110) sequentially stacked on the lower surface of the polarizer (130) in the stated order from the polarizer (130).

The first retardation layer (110) and the second retardation layer (120) may have substantially the same ranges of retardation, material, thickness and wavelength dispersion as those of the polarizing plate described with reference to FIG. 1 except for the tilt angle of the slow axis with reference to the transmission axis of the polarizer. Next, the following description will focus only on the tilt angle.

The slow axis of the second retardation layer (120) may be tilted at an angle of about +44° to about +46° with reference to the transmission axis of the polarizer and the slow axis of the first retardation layer (110) may be tilted at an angle of about +133° to about +137°, preferably about +1340 to about +136°, with reference to the transmission axis of the polarizer. In another embodiment, the slow axis of the second retardation layer (120) may be tilted at an angle of about −44° to about −46° with reference to the transmission axis of the polarizer and the slow axis of the first retardation layer (110) may be tilted at an angle of about −133° to about −137°, preferably about −134° to about −136°, with reference to the transmission axis of the polarizer. Within this range of inclination, the polarizing plate can achieve a minimum ellipticity of 65% or more at a light incidence angle of 600 while reducing reflectivity at front and lateral sides thereof.

When the slow axis of the first retardation layer is substantially orthogonal to the slow axis of the second retardation layer, the effects of the present invention can be easily realized. Here, “substantially orthogonal to” means not only 900 but also an angle in the range of 85° to 95°, preferably 90°.

The slow axis of the first retardation layer (110) at a wavelength of 550 nm may be placed in an oblique direction, for example, at an angle of about 440 to about 46°, with respect to the MD (machine direction) of the first retardation layer.

The slow axis of the second retardation layer (120) at a wavelength of 550 nm may be placed in an oblique direction, for example, at an angle of about 1340 to about 136°, with respect to the machine direction (MD) of the first retardation layer or the second retardation layer.

Next, a polarizing plate according to a further embodiment of the invention will be described.

The polarizing plate includes: a polarizer; a protective film stacked on an upper surface of the polarizer; and a laminate of a first retardation layer and a second retardation layer sequentially stacked on a lower surface of the polarizer, and may further include a third retardation layer.

In one embodiment, the third retardation layer may be interposed between the polarizer and the first retardation layer. In another embodiment, the third retardation layer may be interposed between the polarizer and the second retardation layer.

The third retardation layer may include a positive C layer that satisfies a relation: nz>nx≈ny (nx, ny, and nz being the indexes of refraction of the third retardation layer in the slow axis direction, the fast axis direction, and the thickness direction thereof at a wavelength of 550 nm, respectively).

In one embodiment, the third retardation layer may have an out-of-plane retardation of about −300 nm to about 0 nm, for example, about −80 nm to about 0 nm, about −80 nm to about −20 nm, about −80 nm to about −30 nm, at a wavelength of 550 nm. The third retardation layer may have an in-plane retardation of about 0 nm to about 10 nm, for example, about 0 nm to about 5 nm, at a wavelength of 550 nm. Within these ranges, the polarizing plate can realize the reduction in reflectivity described above.

In one embodiment, the third retardation layer may be a liquid crystal layer. The liquid crystal layer may be formed of a typical material known to realize the above out-of-plane retardation.

In another embodiment, the third retardation layer may be formed of a composition that forms the second retardation layer described above.

An optical display device according to the present invention includes the polarizing plate according to the embodiments of the invention. The optical display device may include an organic light emitting diode (OLED) display and a liquid crystal display.

In one embodiment, the organic light emitting diode display may include an organic light emitting diode panel, which includes a flexible substrate, and the polarizing plate according to the present invention stacked on the organic light emitting diode panel.

In another embodiment, the organic light emitting diode display may include an organic light emitting diode panel, which includes a non-flexible substrate, and the polarizing plate according to the present invention stacked on the organic light emitting diode panel.

MODE FOR INVENTION

Next, the present invention will be described in more detail with reference to some examples. However, it should be noted that these examples are provided for illustration only and are not to be construed in any way as limiting the invention.

Example 1

A polarizer having a light transmittance of 45% was prepared by stretching a polyvinyl alcohol based film (PS #60, pre-stretching thickness: 60 μm, Kuraray Co., Ltd., Japan) to 6 times an initial length thereof in an aqueous solution of iodine at 55° C.

A coat ((−) birefringence)) for a second retardation layer was formed by coating a composition for the second retardation layer [non-liquid crystal composition including a cellulose ester based polymer (containing a trifluoroacetyl group), the cellulose ester polymer comprising 5 wt % of fluorine] on a lower surface of a cyclic polyolefin (COP) based non-stretched film ((+) birefringence). The cellulose ester based polymer was prepared through reaction and polymerization after addition of trifluoroacetic acid and trifluoroacetic anhydride to unsubstituted cellulose.

After drying the coat, a laminate of a first retardation layer (flat wavelength dispersion) and a second retardation layer (positive wavelength dispersion) having specifications as listed in Table 1 was prepared by stretching a laminate of the coat and the COP-based non-stretched film in an oblique direction of 450 with respect to the MD of the COP-based non-stretched film.

As a protective film, an HC-TAC film (Toppan, 25FJCHCN-TC, thickness: 32 m) was stacked on an upper surface of the polarizer, followed by stacking the laminate of the first retardation layer (thickness: 60 m) and the second retardation layer (thickness: 11 m) on a lower surface of the polarizer, thereby preparing a polarizing plate in which the first retardation layer and the second retardation layer (thickness: 11 m) are sequentially stacked in the stated order from the polarizer.

Examples 2 to 4

Polarizing plates were prepared in the same manner as in Example 1 except that the retardation of each of the first retardation layer and the second retardation layer was changed as listed in Table 1 by changing the stretching ratio, the temperature upon stretching, and the like.

Examples 5, 6 and 8

Polarizing plates were prepared in the same manner as in Example 1 except that the tilt angle of the slow axis of each of the first retardation layer and the second retardation layer with reference to the transmission axis of the polarizer was changed as listed in Table 1.

Example 7

A polarizing plate was prepared in the same manner as in Example 1 except that the stacking order of the first retardation layer and the second retardation layer was changed as listed in Table 1.

Comparative Examples 1 to 6

Polarizing plates were prepared in the same manner as in Example 1 except that the retardation of each of the first retardation layer and the second retardation layer was changed as listed in Table 2 by changing the stretching ratio, the temperature upon stretching, and the like.

Comparative Example 5

A polarizing plate was prepared in the same manner as in Example 1 except that the first retardation layer was formed of a cellulose ester based polymer and the second retardation layer was formed of a cyclic polyolefin (COP) based resin.

Re and NZ of each of the first retardation layer and the second retardation layer were measured at a wavelength of 550 nm using an AxoScan (Axometry Co., Ltd.). Wavelength dispersion of each of the first retardation layer and the second retardation layer was measured using an AxoScan (Axometry Co., Ltd.).

The polarizing plates of Examples and Comparative Examples were evaluated as to the following properties and evaluation results are shown in Tables 1 and 2.

(1) Reflectivity (unit: %): Reflectivity was calculated by the Extended Jones Matrix calculation method with parameters obtained from each of the layers of the polarizing plate, assuming complete reflection. Here, outermost primary reflection was excluded in calculation. Front reflectivity and maximum reflectivity on an inclined surface excluding a front surface are listed. It is desirable that the maximum reflectivity be 15% or less.

(2) Front color value: Color values a* and b* were calculated in the same manner as in measurement of reflectivity.

TABLE 1

| | | Example | | | | | | | |
|---|---|---|---|---|---|---|---|---|---|
| | | 1 | 2 | 3 | 4 | 5 | 6 | 7 | 8 |
| First retardation layer | Re | 320 | 350 | 280 | 400 | 320 | 320 | 320 | 320 |
| First retardation layer | NZ | 1.1 | 1.2 | 1.1 | 1.1 | 1.1 | 1.1 | 1.1 | 1.1 |
| First retardation layer | Short wavelength dispersion | 1.002 | 1.035 | 1.002 | 1.002 | 1.002 | 1.002 | 1.002 | 1.002 |
| First retardation layer | Long wavelength dispersion | 0.9989 | 0.9796 | 0.9989 | 0.9989 | 0.9989 | 0.9989 | 0.9989 | 0.9989 |
| Second retardation layer | Re | 180 | 210 | 140 | 260 | 180 | 180 | 180 | 180 |
| Second retardation layer | NZ | −0.6 | −0.3 | −0.2 | −0.2 | −0.6 | −0.6 | −0.6 | −0.6 |
| Second retardation layer | Short wavelength dispersion | 1.12 | 1.12 | 1.12 | 1.05 | 1.12 | 1.12 | 1.12 | 1.12 |
| Second retardation layer | Long wavelength dispersion | 0.95 | 0.95 | 0.95 | 0.97 | 0.95 | 0.95 | 0.95 | 0.95 |
| Angle 1 (°) | | +45 | +45 | +45 | +45 | +44 | +46 | +135 | +45 |
| Angle 2 (°) | | +135 | +135 | +135 | +135 | +134 | +136 | +45 | +137 |
| In-plane retardation difference | | 140 | 140 | 140 | 140 | 140 | 140 | 140 | 140 |
| Reflectivity | Front | 0.15 | 0.32 | 0.21 | 0.24 | 0.19 | 0.19 | 0.15 | 0.30 |
| Reflectivity | Max | 3.99 | 9.5 | 7.72 | 8.68 | 4.00 | 4.65 | 13.97 | 5.61 |
| Front color value | a* | 2.0 | 10.8 | 6.1 | 10.5 | 2.5 | 2.5 | 2.5 | 2.6 |
| Front color value | b* | −1.2 | −14.9 | −8.9 | −17.9 | −2.0 | −2.0 | −2.1 | −0.2 |

TABLE 2

| | | Comparative Example | | | | | |
|---|---|---|---|---|---|---|---|
| | | 1 | 2 | 3 | 4 | 5 | 6 |
| First retardation layer | Re | 270 | 280 | 320 | 320 | 320 | 320 |
| First retardation layer | NZ | 1.1 | 1.6 | 1.1 | 1.1 | -0.6 | 1.1 |
| First retardation layer | Short wavelength dispersion | 1.002 | 1.002 | 1.002 | 1.002 | 1.12 | 1.002 |
| First retardation layer | Long wavelength dispersion | 0.9989 | 0.9989 | 0.9989 | 0.9989 | 0.95 | 0.9989 |
| Second retardation layer | Re | 130 | 140 | 160 | 200 | 180 | 180 |
| Second retardation layer | NZ | −0.2 | −0.2 | −0.6 | −0.6 | 1.1 | 0.5 |
| Second retardation layer | Short wavelength dispersion | 1.05 | 1.05 | 1.12 | 1.12 | 1.002 | 1.12 |
| Second retardation layer | Long wavelength dispersion | 0.97 | 0.97 | 0.95 | 0.95 | 0.9989 | 0.95 |
| Angle 1 (°) | | +45 | +45 | +45 | +45 | +45 | +45 |
| Angle 2 (°) | | +135 | +135 | +135 | +135 | +135 | +135 |
| In-plane retardation difference | | 140 | 140 | 160 | 120 | 140 | 140 |
| Reflectivity | Front | 0.39 | 0.38 | 0.83 | 1.94 | 2.08 | 0.15 |
| Reflectivity | Max | 8.20 | 29.16 | 4.04 | 9.34 | 31.8 | 26.92 |
| Front color value | a* | 21.3 | 20.4 | -9.8 | 11.6 | 55.5 | 2.5 |
| Front color value | b* | −28.0 | −27.3 | −16.3 | 0.9 | −62.2 | −2.1 |

*Angle 1: Angle of slow axis of first retardation layer with reference to transmission axis of the polarizer

*Angle 2: Angle of slow axis of second retardation layer with reference to transmission axis of the polarizer

*In-plane retardation difference: In-plane retardation of first retardation layer-in-plane retardation of second retardation layer As shown in Table 1, the polarizing plates according to the present invention had low reflectivity at a front side thereof to achieve remarkable improvement in screen quality through improvement in black visibility at the front side thereof when applied to an optical display device, and had front color values near neutral color values to achieve remarkable improvement in screen quality through improvement in black visibility when applied to an optical display device.

Conversely, as shown in Table 2, the polarizing plates of Comparative Examples failing to satisfy all elements of the present invention had much higher reflectivity than the polarizing plates according to the present invention and/or failed to satisfy the front color values a* and b* according to the present invention.

It should be understood that various modifications, changes, alterations, and equivalent embodiments can be made by those skilled in the art without departing from the spirit and scope of the invention.

The invention claimed is:

1. A polarizing plate comprising:

a polarizer and a laminate of a first retardation layer and a second retardation layer stacked on a lower surface of the polarizer, the laminate of the first retardation layer and the second retardation layer is formed by coating a composition for the second retardation layer on an unstretched film for the first retardation layer to form a coat, and then integrally subjecting the unstretched film and the coat to one-time oblique stretching, wherein the oblique stretching refers to stretching in an inclined direction relative to a machine direction (MD) of the unstretched film;

wherein short wavelength dispersion of the first retardation layer is less than short wavelength dispersion of the second retardation layer, the first retardation layer has an in-plane retardation of 280 nm to 400 nm and a degree of biaxiality of greater than 1 to less than 1.6 at a wavelength of 550 nm, the second retardation layer has an in-plane retardation of 140 nm to 260 nm and a degree of biaxiality of less than 0 at a wavelength of 550 nm, and a difference between in-plane retardation of the first retardation layer at a wavelength of 550 nm and in-plane retardation of the second retardation layer at a wavelength of 550 nm is in the range of 130 nm to 150 nm, wherein the first retardation layer exhibits positive wavelength dispersion; the second retardation layer exhibits positive wavelength dispersion; and the laminate of the first retardation layer and the second retardation layer exhibits negative wavelength dispersion.

2. The polarizing plate as claimed in claim 1, wherein the first retardation layer comprises a compound having positive (+) birefringence and the second retardation layer comprises a compound having negative (−) birefringence.

3. The polarizing plate as claimed in claim 1, wherein each of the first retardation layer and the second retardation layer is a non-liquid crystal layer.

4. The polarizing plate as claimed in claim 1, wherein the first retardation layer comprises at least one resin of cellulose based, polyester based, cyclic polyolefin based, cyclic olefin copolymer based, polycarbonate based, polyethersulfone based, polysulfone based, polyamide based, polyimide based, polyolefin based, polyarylate based, polyvinylalcohol based, polyvinylchloride based, polyvinylidenechloride based, and acrylic based resins.

5. The polarizing plate as claimed in claim 1, wherein the second retardation layer comprises at least one of a cellulose based compound and an aromatic based compound.

6. The polarizing plate as claimed in claim 5, wherein the cellulose based compound comprises at least one of a cellulose ester based compound and a cellulose ether based compound.

7. The polarizing plate as claimed in claim 1, wherein the second retardation layer has a degree of biaxiality of about −1.0 to about −0.1 at a wavelength of 550 nm.

8. The polarizing plate as claimed in claim 1, wherein the first retardation layer has a slow axis placed in an oblique direction with respect to the MD of the first retardation layer at a wavelength of 550 nm.

9. The polarizing plate as claimed in claim 8, wherein the slow axis of the first retardation layer is tilted at an angle of about 43° to about 47° with respect to the MD of the first retardation layer.

10. The polarizing plate as claimed in claim 1, wherein the second retardation layer has a slow axis placed in an oblique direction with respect to a MD of the first retardation layer or the second retardation layer at a wavelength of 550 nm.

11. The polarizing plate as claimed in claim 10, wherein the slow axis of the second retardation layer is tilted at an angle of about 133° to about 137° with respect to the MD of the first retardation layer or the second retardation layer.

12. The polarizing plate as claimed in claim 1, wherein the first retardation layer is a positive A or negative B plate and the second retardation layer is a negative A or positive B plate.

13. The polarizing plate as claimed in claim 1, wherein long wavelength dispersion of the first retardation layer is greater than long wavelength dispersion of the second retardation layer.

14. The polarizing plate as claimed in claim 1, wherein the first retardation layer has a short wavelength dispersion of about 0.95 to about 1.06 and a long wavelength dispersion of about 0.96 to about 1.03, and the second retardation layer has a short wavelength dispersion of about 1 to about 1.2 and a long wavelength dispersion of about 0.90 to about 1.

15. The polarizing plate as claimed in claim 1, wherein a slow axis of the first retardation layer is tilted at an angle of about 44° to 46° and a slow axis of the second retardation layer is tilted at an angle of 134° to 136°, with reference to a transmission axis of the polarizer.

16. The polarizing plate as claimed in claim 1, wherein a slow axis of the first retardation layer is tilted at an angle of 134° to 136° and a slow axis of the second retardation layer is tilted at an angle of 44° to 46°, with reference to a transmission axis of the polarizer.

17. The polarizing plate as claimed in claim 1, wherein the first retardation layer and the second retardation layer are sequentially stacked in the stated order on the lower surface of the polarizer, or the second retardation layer and the first retardation layer are sequentially stacked in the stated order on the lower surface of the polarizer.

18. The polarizing plate as claimed in claim 1, further comprising: a protective layer on an upper surface of the polarizer.

19. An optical display device comprising the polarizing plate as claimed in claim 1.

* * * * *